(12) United States Patent
Budny

(10) Patent No.: US 12,736,584 B2
(45) Date of Patent: Sep. 15, 2026

(54) METHOD FOR INDICATING A STATE OF A BATTERY OF A VEHICLE

(71) Applicant: AUDI AG, Ingolstadt (DE)

(72) Inventor: Lukas Budny, Rohrbach (DE)

(73) Assignee: AUDI AG, Ingolstadt (DE)

( * ) Notice: Subject to any disclaimer, the term of this patent is extended or adjusted under 35 U.S.C. 154(b) by 282 days.

(21) Appl. No.: 17/545,299

(22) Filed: Dec. 8, 2021

(65) Prior Publication Data

US 2022/0229118 A1 Jul. 21, 2022

(30) Foreign Application Priority Data

Jan. 18, 2021 (DE) ........................ 102021100923.5

(51) Int. Cl.
*G01R 31/371* (2019.01)
*B60L 58/10* (2019.01)
*G08B 25/10* (2006.01)

(52) U.S. Cl.
CPC ............ *G01R 31/371* (2019.01); *B60L 58/10* (2019.02); *G08B 25/10* (2013.01)

(58) Field of Classification Search
CPC ............ B60L 2250/10; B60L 2250/16; B60L 3/0046; B60L 58/10; B60L 58/12; G01R 31/3646; G01R 31/371; G08B 21/182; G08B 25/10
USPC ........................................................ 702/63
See application file for complete search history.

(56) References Cited

U.S. PATENT DOCUMENTS

| | | | | |
|---|---|---|---|---|
| 10,601,523 | B1 * | 3/2020 | Abhishek | H04B 14/04 |
| 2014/0253326 | A1 | 9/2014 | Cho et al. | |
| 2015/0148681 | A1 * | 5/2015 | Abreu | A61B 5/6821 600/474 |
| 2018/0238994 | A1 * | 8/2018 | Da Silva Freitas | G01S 11/14 |
| 2018/0252796 | A1 * | 9/2018 | Qu | G01S 5/26 |
| 2019/0135126 | A1 * | 5/2019 | Schmitt | B60L 3/0046 |

FOREIGN PATENT DOCUMENTS

| | | | |
|---|---|---|---|
| BR | PI05502002-6 | A2 | 11/2006 |
| CN | 101237765 | A | 8/2008 |
| CN | 101863254 | A | 10/2010 |
| CN | 103419671 | A | 12/2013 |
| CN | 112104430 | A | 12/2020 |
| DE | 102008004111 | A1 | 7/2009 |
| DE | 102010042432 | A1 | 4/2012 |
| DE | 102011006510 | A1 | 10/2012 |

(Continued)

OTHER PUBLICATIONS

German Search Report issued on Sep. 20, 2021 in corresponding German Application No. 102021100923.5; 10 pages; Machine translation attached.

(Continued)

*Primary Examiner* — Andrew Schechter
*Assistant Examiner* — Joshua L Forristall
(74) *Attorney, Agent, or Firm* — Maier & Maier, PLLC

(57) ABSTRACT

A method for indicating a state of a battery of a vehicle when the vehicle has suffered an accident, in which acoustic signals, which include coded items of information about at least one operating parameter of the battery, are sent by a loudspeaker of the vehicle. The acoustic signals are received by a microphone of a terminal and the coded items of information are decoded and output by the terminal.

12 Claims, 1 Drawing Sheet

(56) References Cited

FOREIGN PATENT DOCUMENTS

| | | | | |
|---|---|---|---|---|
| DE | 102012102664 A1 | * | 10/2013 | ......... G01R 31/3682 |
| DE | 202016002778 U1 | | 7/2016 | |
| DE | 102015015666 A1 | | 8/2016 | |
| DE | 102018107756 A1 | | 10/2018 | |
| DE | 102017216517 A1 | | 3/2019 | |
| DE | 102017219990 A1 | | 5/2019 | |
| JP | 2018191228 | * | 11/2018 | |

OTHER PUBLICATIONS

Office Action issued on Nov. 26, 2024, in corresponding Chinese Application No. 202111529932.1, 18 pages.

Office Action issued on May 27, 2025, in corresponding Chinese Application No. 202111529932.1, 29 pages.

* cited by examiner

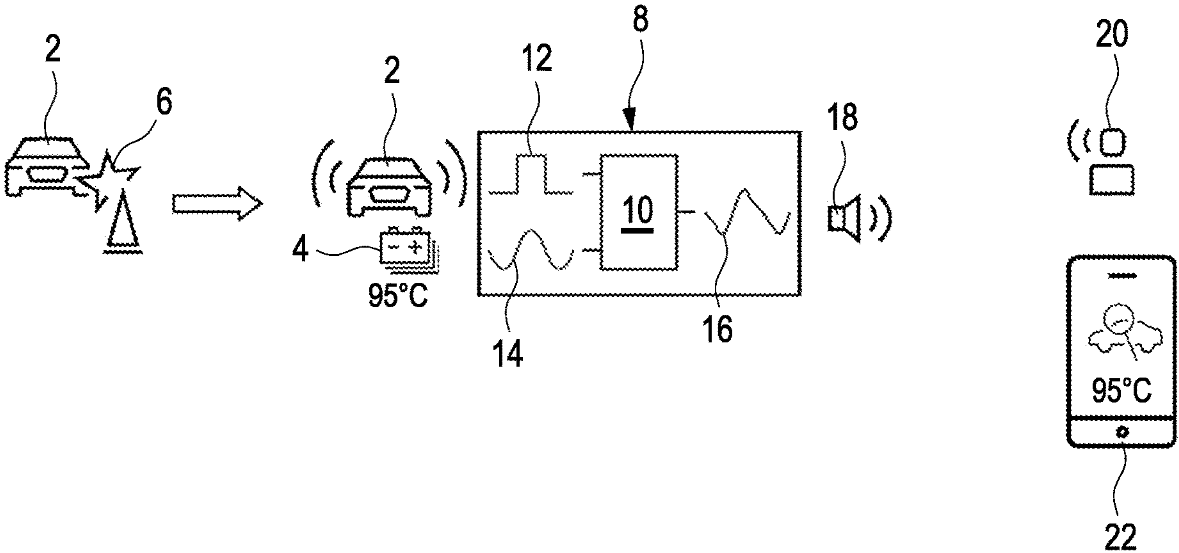
2
6
2
4
95°C
8
12
10
14
16
18
20
95°C
22

METHOD FOR INDICATING A STATE OF A BATTERY OF A VEHICLE

FIELD

The invention relates to a method for indicating a state of a battery of a vehicle and a system for indicating a state of a battery of a vehicle.

BACKGROUND

In case of an accident with a battery-operated vehicle (BEV), certain dangers always arise. A danger arises in this case in the event of overheating or a fire of a traction battery of the vehicle. Up to this point, there have been no sufficient, externally recognizable signs about a state of the traction battery. This makes it incalculably dangerous for first responders or for the emergency services, for example the fire department or police, to approach such vehicle that has been involved in an accident. There is also reluctance of first responders, as it is difficult to assess whether and when a vehicle could become a hazard. In contrast to this, in a vehicle that is driven by an internal combustion engine, dangers are announced via leaking fuel or smoke. In a battery-powered vehicle, a fire can start much faster and without much notice.

A method for managing a performance of an automobile is known from document CN 101863254 A.

Document DE 10 2012 102 664 A1 describes a warning device for a high-voltage battery system.

A warning method for a high-voltage battery of a motor vehicle is known from document DE 10 2017 219 990 A1.

SUMMARY

Against this background, one object was to suitably indicate dangers that could arise from a battery-operated vehicle after an accident.

The method according to the invention is provided for indicating a state of a battery of a vehicle after the vehicle has suffered an accident. In the method, acoustic signals are sent or emitted by a loudspeaker of the vehicle, which include coded items of information about at least one operating parameter of the battery of the vehicle. These acoustic signals are received by a microphone of an external, vehicle-independent terminal. Furthermore, the items of coded information within the acoustic signals are decoded by the terminal device, usually a computing unit of the terminal device, and output by an acoustic and/or optical display device of the terminal device to or for a user of the terminal device in a visually and/or acoustically comprehensible manner, whereby the user is informed about the state of the battery after the accident of the vehicle.

The method provides that the vehicle, for example a control unit of the vehicle, has a modulator for acoustic signals, which is designed to modulate the coded items of information about the state of the battery as acoustic signals and/or to modulate them onto further acoustic signals wherein the coded items of information are modulated accordingly and, for example, are modulated as primary acoustic signals onto further, secondary acoustic signals. It is thus possible for the loudspeaker to send two types of acoustic signals. The acoustic signals sent overall include the modulated and coded items of information as primary acoustic signals and further secondary acoustic signals, which are usually audible to a human, and which usually audibly indicate a possible danger arising from the battery as alarm signals.

However, it is also possible that the primary acoustic signals having the coded items of information are also audible by a human, wherein these primary acoustic signals as carriers of the coded items of information can be at least partially or completely digitized.

In one embodiment, the coded items of information about the operating state of the battery are sent via acoustic signals at a frequency that is greater than a frequency for acoustic signals that is audible to a human. The audible, usually secondary acoustic signals comprise at least alarm tones or warning tones. However, it is also possible for the loudspeaker to use acoustically perceptible signals which explicitly and in text form indicate the existing danger that can arise from the battery. The user can thus be informed that a danger has arisen from a battery of the vehicle, and/or that it has reached a critical temperature.

Regardless of whether signals that explicitly indicate the danger from the battery are now acoustically perceptible and/or coded and/or acoustically imperceptible because they are sent on the frequency that is above the perceptible frequency, they comprise, for example, items of information about a temperature and/or a state of charge as the at least one operating parameter of the battery.

Furthermore, it is possible for a volume and/or a frequency of the perceptible acoustic signals to be varied as a function of the at least one operating state of the battery. It is possible to set the volume and/or the frequency higher, the higher or more critical the danger is. Regardless of this, the signals which comprise the items information about the at least one operating parameter and are coded and optionally modulated can be provided as ultrasonic signals or hypersonic signals.

According to one embodiment, the acoustic signals of the loudspeaker therefore have an imperceptible part and a perceptible part.

It is also provided that the method is carried out for a vehicle that has a battery, for example, a traction battery and/or high-voltage battery, in which electrical energy for driving or moving the vehicle is stored.

The method can in principle be carried out when the vehicle has suffered the accident, regardless of how serious the accident is. The method is carried out in particular if the vehicle is on fire due to the accident, or at least there is the danger exists that it could catch fire.

In one embodiment, reference is made to a state of the battery, designed as a high-voltage battery and/or traction battery, of a vehicle designed as a motor vehicle. This can be an electric vehicle or a hybrid vehicle which, in addition to an electric motor, also has an internal combustion engine for driving purposes.

In a further embodiment, the coded and/or modulated acoustic signals of the loudspeaker are decoded and/or demodulated by a mobile portable terminal which is designed for communication and data processing using software, that is to say an application or app. This software can be installed and executed on the mobile portable terminal at any time. Such a terminal is designed or referred to, for example, as a smartphone or tablet.

The system according to the invention is designed to indicate a state of a battery of a vehicle when or after the vehicle has suffered an accident. In this case, the system has at least one loudspeaker of the vehicle, which is designed to send acoustic signals which include coded items of information about at least one typical current operating parameter of the battery. In addition, a microphone of an external, vehicle-independent terminal is designed to receive the acoustic signals, to decode the coded items of information about the at least one operating parameter of the battery, and to output them in an acoustically and/or visually comprehensible manner to or for a user of the terminal.

For this purpose, it is provided that, depending on the definition, the terminal can be designed as a component of the presented system, wherein this terminal can also be used independently of the system and/or the presented method.

Furthermore, it is possible that the system has a central device, for example a data processing device or a server, which is designed to provide software and thus an application or app that is installable or installed on a processing unit of the terminal device, wherein this software is designed to prompt the terminal to recognize the coded items of information from the acoustic signals provided, to decode them and, on the basis of this, to provide the user with comprehensible explicit items of information about the current state of the battery. A loudspeaker and/or a display panel or display of the terminal is typically used for this purpose. Furthermore, it is possible for the loudspeaker of the vehicle, which is designed to send the coded items of information via the acoustic signals, to be arranged in the vehicle anyway and also to be used for other purposes. However, it is also possible for this loudspeaker to be arranged in the vehicle explicitly as part of the system for carrying out the method.

The presented system is designed to carry out an embodiment of the presented method.

In one embodiment, the system has as a component a control unit of the vehicle, which is designed to detect the at least one typically current operating parameter of the battery, to activate the loudspeaker, and to cause the loudspeaker to send the acoustic signals that comprise the items of coded information regardless of whether or not the acoustic signals are audible or perceptible.

Using the method and the system, it is thus possible to provide the items of information about the state or a status of the battery of the vehicle in case of an accident to the terminal and also to the user via the acoustic signals or a corresponding acoustic channel.

In a further embodiment, it is possible that the acoustic signals having the coded items of information are output directly from the battery, for example, the traction battery, or from the battery as a component of the vehicle, wherein a report about the state after the accident is provided using these items of information. The acoustic signals or a corresponding acoustic output can be implemented with the aid of a loud, recurring beep. In this case, a first responder as the user of the terminal is provided with a clear indication that the battery of the vehicle poses little or no danger. It is additionally possible that the beep is acoustically output proportionally to the state, for example, the state of health, of the battery, which is dependent on the temperature, for example. If there is no danger from the battery, only short loud beeps with short repetitions are provided. However, the more critical the state of the battery becomes, if the battery heats up quickly, for example, the higher a frequency of the beep tones is set, wherein the interval between repetitions of the beeps or of repetitions of the beeps decreases, wherein these beeps are converted into a continuous tone if the battery poses a high or maximum danger. This makes it possible for the user or first responder to be able to better assess the danger without additional aids. Furthermore, the loud beeps can make a vehicle that has gone off of the road during an accident able to be located quickly and easily, if the vehicle, for example, has driven down an embankment and is no longer visible from a road.

The acoustic signals, which are usually designed as beeps and/or alarm tones, the acoustic signals that comprise the detailed items of information about the at least one operating parameter of the battery, for example a respective current value of the temperature, are concealed based on the coding and/or modulation, wherein it is possible that the acoustic signals that carry these items of information can be digitized. These acoustic signals having the items of information about the at least one operating parameter can be received via the application or an app, which is publicly accessible or at least accessible to rescue workers, from the microphone of the mobile terminal, for example a smartphone, usually recognized as such, demodulated and decoded and, and furthermore clear and comprehensible items of information can be acoustically and/or optically represented, wherein these clear items of information comprise, for example, a physical value of the temperature as the at least one operating parameter of the battery. It is thus possible, for example, for a rescue worker as a user to be informed of the operating state of the battery and thus of a specific danger, whereby the user can better assess the risk.

In this embodiment, it is possible that the audible beeps or alarm tones already comprise the coded items of information about the at least one operating parameter of the battery. The beeps or alarm tones can be at least partially digital and, for example, can have a structure similar to tones as they were used in the 1980s on music cassettes or so-called datasettes for storing data for home computers.

It is possible that in the battery, for example a traction battery, an acoustic actuator is installed as a loudspeaker, so that the loudspeaker is not only designed as a component of the vehicle, but also directly as a component of the battery. The loudspeaker is usually activated via an internal control unit, for example by a battery management system (BMS). It is possible here that a hazard indicator is calculated by the control unit on the basis of an algorithm, using which the at least one, usually internal, operating state of the battery, that is to say the temperature or cell temperature and/or the voltage or cell voltage, and, for example, an acceleration of the vehicle that occurred before the accident is taken into consideration. With this hazard indicator, a specific danger of the battery, which is caused by the battery, can be taken into consideration. This is possible, for example, in the event that the battery is on the verge of a thermal runaway. An acoustic warning tone is provided as an acoustic signal from a certain danger level if the hazard indicator determines that the at least one operating parameter of the battery exceeds a predetermined critical value, wherein the warning tone is caused to be output by the built-in loudspeaker, for example. The hazard indicator or corresponding information can also be coded and modulated.

It is possible that the volume and/or frequency of the warning tone is usually set in direct proportion to the danger level. The greater the danger level, the louder the warning tone and the higher the frequency, which means that the intervals between individual beeps are reduced. The acoustic and thus usually audible signals can have different signal forms and do not necessarily have to be designed as beeps. The system and the loudspeaker are only activated after the accident has been recognized for the vehicle, usually by its control unit.

It is apparent that the above-mentioned features and the features still to be explained hereinafter are usable not only in the particular specified combination but rather also in other combinations or alone, without leaving the scope of the present invention.

BRIEF DESCRIPTION OF THE FIGURE(S)

The invention is illustrated schematically in the drawing on the basis of embodiments and will be described schematically and in detail with reference to the drawing.

FIG. 1 shows a schematic illustration of a diagram for a sequence of an embodiment of the method according to the invention.

DETAILED DESCRIPTION

The diagram from FIG. 1 is provided for the schematic illustration of the embodiment of the method according to the invention using an embodiment of a system according to the invention. The diagram from FIG. 1 twice shows a vehicle 2, here a motor vehicle, which has a battery 4 in which electrical energy for driving or moving the vehicle 2 is stored. It is provided that the vehicle 2 has a control unit 8 having a modulator 10 and a loudspeaker 18.

It is also provided that the vehicle 2 is involved in an accident 6 and/or has suffered an accident 6. In this case, the accident 6 is usually registered by the control unit 8 via a sensor (not shown in more detail) that detects the accident 6. In this case, two types of acoustic signals 12, 14 are generated by the control unit 8. Secondary acoustic signals 12 comprise warning tones in a frequency range audible to a human, here a user 20. In the embodiment of the method presented here, primary acoustic signals 14 are modulated onto these secondary acoustic signals 12 by the modulator 10, wherein resulting acoustic signals 16, which comprise the primary and secondary signals 12, 14, are provided and sent or emitted by the loudspeaker 18.

At least the secondary acoustic signals 12 are perceived by the sense of hearing of the user 20. It is also provided that the user 20 has a smartphone as the terminal 22 here. This also has a microphone for receiving the resulting acoustic signals 16. The method provides that the primary acoustic signals 14 comprise information about an operating state of the battery 4, here about the temperature of the battery 4, which in the present case is, for example, 95° C. The coded and modulated primary acoustic signals 14 are demodulated and decoded by a computing unit of the terminal 22 using software. The primary acoustic signals 14 are machine-readable and/or machine-comprehensible for the computing unit of the terminal 22. In this case, the current value of the temperature of the battery 4 of the vehicle 2, 95° C. here, is visually and comprehensibly displayed to the user 20 using a display panel of the terminal 22.

If the vehicle 2, here a battery-operated vehicle 2 (BEV), suffers the accident 6, a function of the embodiment of the method is automatically activated, wherein a hazard indicator is calculated by the control unit 8. On the basis of the hazard indicator, which is dependent on at least one operating parameter of the battery 4, a corresponding warning tone is output as a secondary acoustic signal 12. In addition, items of information about the at least one battery state, here at least the temperature, are encoded as primary signals 14 and modulated onto the secondary signals 12 by the modulator 10. The user as first responder and/or rescue worker hears at least the secondary acoustic signals 12 or corresponding warning tones and can intuitively assess a possible danger situation depending on the volume and/or frequency of the secondary signals 12 or warning tones. In addition, the primary signals 14 are recorded by the microphone of the terminal 22 and demodulated with the aid of software, for example an app provided for this purpose, wherein the items of information contained therein are decoded. These items of information about the at least one operating parameter and thus a state of the battery 4 are displayed on the terminal 22.

REFERENCE NUMERALS

2 vehicles
4 batteries
6 accidents
8 control unit
10 modulators
12, 14, 16 signal
18 loudspeakers
20 users
22 terminals

The invention claimed is:

1. A method for indicating a state of a battery of a vehicle when the vehicle has suffered an accident, the method comprising:

sending, by a loudspeaker of the vehicle, combined acoustic signals, the combined acoustic signals comprising both primary acoustic signals with coded items of information about at least one operating parameter of the battery and secondary acoustic signals that audibly indicate a possible danger arising from the battery, wherein the primary acoustic signals are modulated onto the secondary acoustic signals to produce the combined acoustic signals, both the primary acoustic signals and the secondary acoustic signals are audible by a human, the combined acoustic signals include perceptible sounds that have frequencies that are proportional to a temperature of the battery, and the frequencies shift to a continuous tone after the temperature of the battery exceeds a threshold;

receiving, by a microphone of a terminal, the coded items of information; and decoding, by the terminal, the coded items of information.

2. The method as claimed in claim 1, wherein a volume of the combined acoustic signals is or are varied as a function of the at least one operating state.

3. The method as claimed in claim 1, wherein the combined acoustic signals are decoded by a mobile portable terminal using software.

4. The method as claimed in claim 1, wherein the combined acoustic signals include items of information about a temperature and/or a state of charge as the at least one operating parameter of the battery.

5. The method as claimed in claim 1, wherein a frequency of the combined acoustic signals is or are varied as a function of the at least one operating state.

6. The method as claimed in claim 1, wherein the combined acoustic signals include items of information about a state of charge as the at least one operating parameter of the battery.

7. The method as claimed in claim 6, wherein a volume and/or a frequency of the combined acoustic signals is or are varied as a function of the at least one operating state.

8. A system for indicating a state of a battery of a vehicle when the vehicle has suffered an accident, comprising:

a loudspeaker of the vehicle configured to send combined acoustic signals comprising both primary acoustic signals which include coded items of information about at least one operating parameter of the battery and secondary acoustic signals that audibly indicate a possible danger arising from the battery, wherein the primary acoustic signals are modulated onto the secondary acoustic signals to produce the combined acoustic signals, both the primary acoustic signals and the secondary acoustic signals are audible by a human, the combined acoustic signals include perceptible sounds that have frequencies that are proportional to a temperature of the battery, and the frequencies shift to a continuous tone after the temperature of the battery exceeds a threshold; and a microphone of a terminal is configured to receive the acoustic signals, and to decode and output the coded items of information.

9. The system as claimed in claim 8, further comprising:

a control unit configured to:

detect the at least one operating parameter of the battery, activate, by a Battery Management System (BMS), the loudspeaker, and cause the loudspeaker to send the combined acoustic signals.

10. The system as claimed in claim 8, wherein the combined acoustic signals include items of information about a temperature and/or a state of charge as the at least one operating parameter of the battery.

11. The system as claimed in claim 8, wherein a volume and/or a frequency of the combined acoustic signals is or are varied as a function of the at least one operating state.

12. The system as claimed in claim 8, wherein the combined acoustic signals are decoded by a mobile portable terminal using software.

* * * * *